(12) United States Patent
Caudill et al.

(10) Patent No.: US 8,327,727 B2
(45) Date of Patent: Dec. 11, 2012

(54) PROBE TIP

(75) Inventors: Jason C. Caudill, Sunbury, OH (US); Edward C. Maloof, Blacklick, OH (US); Masaki Yamaguchi, Tokyo (JP); Shin Mizuta, Osaka (JP)

(73) Assignee: Lake Shore Cryotronics, Inc., Westerville, OH (US)

( * ) Notice: Subject to any disclaimer, the term of this patent is extended or adjusted under 35 U.S.C. 154(b) by 552 days.

(21) Appl. No.: 12/546,777

(22) Filed: Aug. 25, 2009

(65) Prior Publication Data

US 2010/0064784 A1    Mar. 18, 2010

Related U.S. Application Data

(60) Provisional application No. 61/091,962, filed on Aug. 26, 2008.

(51) Int. Cl.
*G01D 3/036*    (2006.01)
*G01R 31/26*    (2006.01)

(52) U.S. Cl. ............. 73/866.5; 324/750.16; 324/750.22; 324/750.25

(58) Field of Classification Search ............... 73/866.5, 73/864.24–864.25; 324/750.03, 750.14, 324/750.16, 750.22, 750.25, 754.03, 754.11–754.14, 324/755.01, 755.03–755.05, 762.01, 762.05, 324/FOR. 108, FOR. 115
See application file for complete search history.

(56) References Cited

U.S. PATENT DOCUMENTS

| | | | |
|---|---|---|---|
| 3,293,759 A * | 12/1966 | Moe et al. ...................... 33/708 |
| 3,797,310 A | 3/1974 | Babcock et al. |
| 4,115,736 A | 9/1978 | Tracy |
| 4,194,119 A | 3/1980 | MacKenzie |
| 4,499,330 A | 2/1985 | Pustell |
| 4,586,383 A | 5/1986 | Blomquist |
| 4,831,846 A | 5/1989 | Sungaila |
| 4,909,588 A | 3/1990 | Harner et al. |
| 4,963,851 A | 10/1990 | Okano et al. |
| 5,193,912 A | 3/1993 | Saunders |
| 5,286,977 A | 2/1994 | Yokoyama et al. |
| 5,309,088 A * | 5/1994 | Chen ...................... 324/750.03 |
| 5,312,188 A | 5/1994 | Ashe |
| 5,349,543 A * | 9/1994 | Buliszyn et al. ............... 702/41 |
| 5,438,206 A | 8/1995 | Yokoyama et al. |
| 5,479,820 A | 1/1996 | Fekete |
| 5,567,053 A | 10/1996 | Ashe |
| 5,750,978 A | 5/1998 | Kraiczek et al. |
| 6,359,460 B1 * | 3/2002 | Tanaka ................. 324/762.01 X |
| 6,784,663 B2 | 8/2004 | Sarwinski et al. |
| 7,048,732 B2 | 5/2006 | Ellingsen |

(Continued)

OTHER PUBLICATIONS

TTP4 Probe Station Operating Guide, Revision 1.0, P/N 119-503 (Oct. 25, 2005), pp. 1-74.

*Primary Examiner* — Thomas P Noland

(74) *Attorney, Agent, or Firm* — Calfee, Halter & Griswold LLP

(57) ABSTRACT

To eliminate or otherwise reduce unintended movement of a probe tip of a probe assembly being held by a probe arm, the probe assembly includes one or more resilient members that compensate for the contraction or expansion of the probe arm in accordance with the coefficient of thermal expansion of the material from which the probe arm is made. Thus, the probe tip can remain in contact with a sample being measured at the desired location on the sample, during an automated full or wide scale temperature range sweep.

29 Claims, 16 Drawing Sheets

U.S. PATENT DOCUMENTS

| | | |
|---|---|---|
| 7,182,761 B2 | 2/2007 | Garabedian et al. |
| 2002/0147394 A1 | 10/2002 | Ellingsen |
| 2003/0042898 A1 | 3/2003 | Sarwinski et al. |
| 2003/0085721 A1* | 5/2003 | Eldridge et al. .............. 324/754 |
| 2003/0227369 A1 | 12/2003 | Terui et al. |
| 2004/0217530 A1* | 11/2004 | Harris et al. .................... 269/55 |
| 2005/0001487 A1* | 1/2005 | Ausserlechner ............. 307/100 |
| 2005/0131508 A1 | 6/2005 | Garabedian et al. |
| 2005/0164299 A1 | 7/2005 | Stewart |
| 2005/0224592 A1 | 10/2005 | Inoue |
| 2005/0258848 A1* | 11/2005 | Schaeffer et al. ............. 324/754 |
| 2006/0022135 A1* | 2/2006 | Moore et al. ................... 250/309 |
| 2006/0075822 A1 | 4/2006 | Aizawa |
| 2006/0087325 A1 | 4/2006 | Ariav et al. |
| 2006/0156835 A1* | 7/2006 | Mueller et al. ............... 73/866.5 |
| 2006/0288573 A1 | 12/2006 | Aizawa |
| 2007/0185477 A1 | 8/2007 | Hooven |
| 2007/0262782 A1* | 11/2007 | Hartmann ..................... 324/754 |
| 2008/0079449 A1* | 4/2008 | Hobbs .......................... 324/754 |

* cited by examiner

400

400

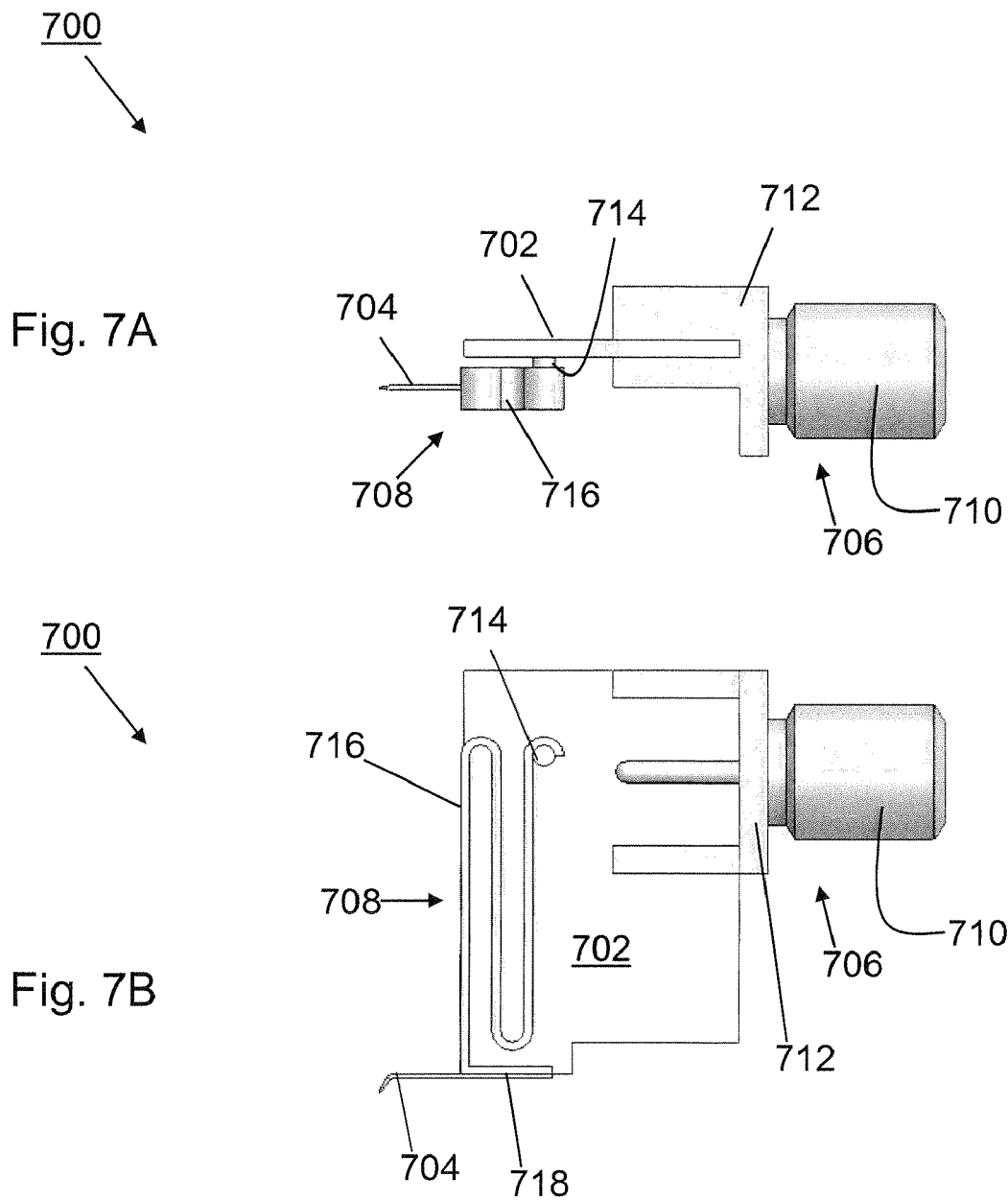

Detail A

PROBE TIP

RELATED APPLICATION

The present application is being filed as a U.S. non-provisional patent application claiming priority/benefit under 35 U.S.C. §119(e) from the U.S. provisional patent application having Ser. No. 61/091,962 and filed on Aug. 26, 2008, the entire disclosure of which is herein incorporated by reference.

FIELD

The invention relates generally to measuring devices and, more particularly, to mechanical probe stations.

BACKGROUND

Mechanical probe stations can be used to measure properties of semiconductor materials and devices (i.e., samples) under cryogenic conditions. For example, a probe station can be used to physically acquire signals from the internal nodes of a semiconductor device. The probe station utilizes manipulators which allow the precise positioning of thin needles (i.e., probe tips) on the surface of the semiconductor device. If the device is being electrically stimulated, the signal is acquired by the probe station and is displayed on an oscilloscope. The probe station is often used in the failure analysis of semiconductor devices.

For example, probe stations can be used to obtain a series of measurements of a sample (e.g., a semiconductor device) over a range of temperatures, which is known as sweeping the temperature range. In conventional probe stations, due to the temperature expansion and contraction coefficients of its materials, a user is unable to automatically sweep the full scale temperature range of the probe station (e.g., 4.2 K to 475 K) without movement of the probe tip. As a result, the probe tip moves from its intended contact point. The unintended movement of the probe tip can result in problems, such as erroneous measurements from and/or damage to the sample being measured.

Current methods of sweeping a temperature range require the user to manually lift the probe tip from the sample being measured, wait for the desired temperature to stabilize, then re-land the probe tip and re-verify sample contact. This is a tedious and inefficient process, particularly when sweeping a wide temperature range.

Accordingly, there is an unmet need for a probe tip that facilitates automated full or wide scale temperature range sweeps with minimal, if any, displacement of the probe tip.

SUMMARY

In view of the above, a probe station having a chamber is disclosed. The probe station can measure properties of a sample placed in the chamber. The chamber can be evacuated to form a vacuum therein. The probe station includes a probe arm and a probe assembly, wherein the probe arm supports the probe assembly within the chamber, wherein the probe assembly includes a resilient member and a probe tip, wherein the probe tip contacts the sample at a location to be measured, and wherein the resilient member is operable to compensate for contraction and expansion of the probe arm due to temperature changes within the chamber, such that the probe tip maintains contact with the sample at the location during the temperature changes.

In an exemplary embodiment, the resilient member is operable to compensate for contraction and expansion of the probe arm across a range of temperatures within the chamber, wherein a size of the range of temperatures is greater than 10 K.

In an exemplary embodiment, the range of temperatures is 1.5 K to 475 K. In an exemplary embodiment, the range of temperatures is within 1.5 K to 475 K.

In an exemplary embodiment, the resilient member includes a vertical member. In an exemplary embodiment, a length of the vertical member is between 5 and 50 mm In an exemplary embodiment, the probe tip is integrated with the vertical member. In an exemplary embodiment, the vertical member is one of a vertical bar, a leaf spring and a double leaf spring.

In an exemplary embodiment, the resilient member further includes a horizontal member, and the vertical member and the horizontal member are connected. In an exemplary embodiment, the vertical member and the horizontal member are substantially perpendicular to one another. In an exemplary embodiment, a length of the horizontal member is between 2 and 50 mm. In an exemplary embodiment, a length of the vertical member is greater than a length of the horizontal member. In an exemplary embodiment, the horizontal member is one of a horizontal bar and an angled horizontal bar.

In an exemplary embodiment, the probe assembly includes a probe body, wherein the resilient member is attached to the probe body and the probe tip is attached to the resilient member. In an exemplary embodiment, the resilient member is disposed adjacent to the probe body. In an exemplary embodiment, at least a portion of the resilient member is in alignment with the probe blade.

In an exemplary embodiment, the resilient member includes a first vertical member, a second vertical member and a horizontal member, and the horizontal member connects the first vertical member and the second vertical member.

In an exemplary embodiment, the resilient member includes a first vertical member, a second vertical member, a first horizontal member and a second horizontal member, wherein the first horizontal member connects the first vertical member and the second vertical member, and wherein the second horizontal member connects the first vertical member and the second vertical member.

In an exemplary embodiment, the resilient member includes a first vertical member, a second vertical member, a third vertical member, a first angled horizontal member and a second angled horizontal member, wherein the first angled horizontal member connects the first vertical member and the second vertical member, and wherein the second angled horizontal member connects the first vertical member and the third vertical member.

In an exemplary embodiment, the resilient member is operable to limit movement of the probe tip on the sample due to temperature changes within the chamber to less than 5 μm.

A probe assembly for use in a probe station is disclosed. The probe station has a chamber, such that the probe station can measure properties of a sample placed in the chamber. The chamber can be evacuated to form a vacuum therein. The probe assembly includes a probe body; a probe tip; and a resilient member, wherein the probe tip is operable to contact the sample at a location to be measured, wherein the probe body is operable to transmit signals between the sample and the probe station, and wherein the resilient member operable to compensate for forces tending to move the probe tip from the location on the sample during temperature changes occurring in the chamber. The resilient member can be disposed adjacent to or in alignment with the probe body.

In an exemplary embodiment, the resilient member is operable to compensate for forces tending to move the probe tip from the location on the sample across a range of temperatures within the chamber, and wherein a size of the range of temperatures is greater than 10 K. In an exemplary embodiment, the range of temperatures is 1.5 K to 475 K. In an exemplary embodiment, the range of temperatures is within 1.5 K to 475 K.

In an exemplary embodiment, the resilient member includes a vertical member. In an exemplary embodiment, a length of the vertical member is between 5 and 50 mm. In an exemplary embodiment, the probe tip is integrated with the vertical member. In an exemplary embodiment, the vertical member is one of a vertical bar, a leaf spring and a double leaf spring.

In an exemplary embodiment, the resilient member further includes a horizontal member, and the vertical member and the horizontal member are connected. In an exemplary embodiment, the vertical member and the horizontal member are substantially perpendicular to one another. In an exemplary embodiment, a length of the horizontal member is between 2 and 50 mm. In an exemplary embodiment, a length of the vertical member is greater than a length of the horizontal member. In an exemplary embodiment, the horizontal member is one of a horizontal bar and an angled horizontal bar.

In an exemplary embodiment, the resilient member is attached to the probe body, and the probe tip is attached to the resilient member. In an exemplary embodiment, the resilient member is disposed adjacent to the probe body. In an exemplary embodiment, at least a portion of the resilient member is in alignment with the probe body.

In an exemplary embodiment, the resilient member includes a first vertical member, a second vertical member and a horizontal member, and wherein the horizontal member connects the first vertical member and the second vertical member.

In an exemplary embodiment, the resilient member includes a first vertical member, a second vertical member, a first horizontal member and a second horizontal member, wherein the first horizontal member connects the first vertical member and the second vertical member, and wherein the second horizontal member connects the first vertical member and the second vertical member.

In an exemplary embodiment, the resilient member includes a first vertical member, a second vertical member, a third vertical member, a first angled horizontal member and a second angled horizontal member, wherein the first angled horizontal member connects the first vertical member and the second vertical member, and wherein the second angled horizontal member connects the first vertical member and the third vertical member.

In an exemplary embodiment, the resilient member is operable to limit movement of the probe tip on the sample due to temperature changes within the chamber to less than 5 μm.

A resilient member for use with a probe assembly of a probe station is disclosed. The probe station has a chamber in which the probe assembly and a sample are supported. The probe assembly includes a probe tip that contacts the sample at a location to be measured. The chamber can be evacuated to form a vacuum therein. The resilient member includes a vertical member, wherein the resilient member is operable to compensate for forces tending to move the probe tip from the location on the sample during temperature changes occurring in the chamber.

In an exemplary embodiment, the resilient member is operable to compensate for forces tending to move the probe tip from the location on the sample across a range of temperatures within the chamber, and wherein a size of the range of temperatures is greater than 10 K. In an exemplary embodiment, the range of temperatures is 1.5 K to 475 K. In an exemplary embodiment, the range of temperatures is within 1.5 K to 475 K.

In an exemplary embodiment, a length of the vertical member is between 5 and 50 mm In an exemplary embodiment, the probe tip is integrated with the vertical member. In an exemplary embodiment, the vertical member is one of a vertical bar, a leaf spring and a double leaf spring.

In an exemplary embodiment, the resilient member further includes a horizontal member, wherein the vertical member and the horizontal member are connected. In an exemplary embodiment, the vertical member and the horizontal member are substantially perpendicular to one another. In an exemplary embodiment, a length of the horizontal member is between 2 and 50 mm. In an exemplary embodiment, a length of the vertical member is greater than a length of the horizontal member. In an exemplary embodiment, the horizontal member is one of a horizontal bar and an angled horizontal bar.

In an exemplary embodiment, the resilient member includes a first vertical member, a second vertical member and a horizontal member, and the horizontal member connects the first vertical member and the second vertical member.

In an exemplary embodiment, the resilient member includes a first vertical member, a second vertical member, a first horizontal member and a second horizontal member, wherein the first horizontal member connects the first vertical member and the second vertical member, and wherein the second horizontal member connects the first vertical member and the second vertical member.

In an exemplary embodiment, the resilient member includes a first vertical member, a second vertical member, a third vertical member, a first angled horizontal member and a second angled horizontal member, wherein the first angled horizontal member connects the first vertical member and the second vertical member, and wherein the second angled horizontal member connects the first vertical member and the third vertical member.

In an exemplary embodiment, the resilient member is operable to limit movement of the probe tip on the sample due to temperature changes within the chamber to less than 5 μm.

Numerous additional advantages and features will become readily apparent from the following detailed description of exemplary embodiments, from the claims and from the accompanying drawings.

DESCRIPTION OF THE DRAWINGS

The general inventive concept of a stable probe tip, as well as illustrative embodiments and exemplary advantages thereof, are described below in greater detail, by way of example, with reference to the drawings wherein like reference numbers denote like elements and in which:

FIG. 4A is a top plan view of the conventional probe assembly. FIG. 4B is a side elevational view of the conventional probe assembly.

FIG. 5A is a top plan view of the probe assembly. FIG. 5B is a side elevational view of the probe assembly.

FIG. 6A is a top plan view of the probe assembly. FIG. 6B is a side elevational view of the probe assembly.

FIGS. 7A and 7B show a probe assembly, according to a third exemplary embodiment, which can be used in the probe station of FIG. 2. FIG. 7A is a top plan view of the probe assembly. FIG. 7B is a side elevational view of the probe assembly.

FIG. 8A is a top plan view of the probe assembly. FIG. 8B is a side elevational view of the probe assembly.

FIG. 9A is a top plan view of the probe assembly. FIG. 9B is a side elevational view of the probe assembly.

FIG. 10A is a top plan view of the probe assembly. FIG. 10B is a side elevational view of the probe assembly.

FIG. 11A is a top plan view of the probe assembly. FIG. 11B is a side elevational view of the probe assembly. FIG. 11C is a perspective view of the probe assembly. FIG. 11D is a front side elevational view of the probe assembly. FIG. 11E is a rear side elevational view of the probe assembly. FIG. 11F is a bottom plan view of the probe assembly.

DETAILED DESCRIPTION

Shown in the accompanying drawings are illustrative embodiments of the general inventive concept, with the understanding that the present disclosure is to be considered as exemplifying the principles of the general inventive concept described herein and presented in the patent claims.

A probe station, according to an exemplary embodiment, includes a probe tip that facilitates automated full scale or wide temperature range sweeps with minimal, if any, displacement of the probe tip. The probe station, for example, can be a model TTP4 probe station (hereinafter, the "TTP4 probe station"), manufactured and sold by Lake Shore Cryotronics, Inc. By way of overview, operation of the TTP4 probe station is described in the *TTP4 Probe Station Operating Guide*, Revision 1.0 (Oct. 25, 2005).

Figure 1:
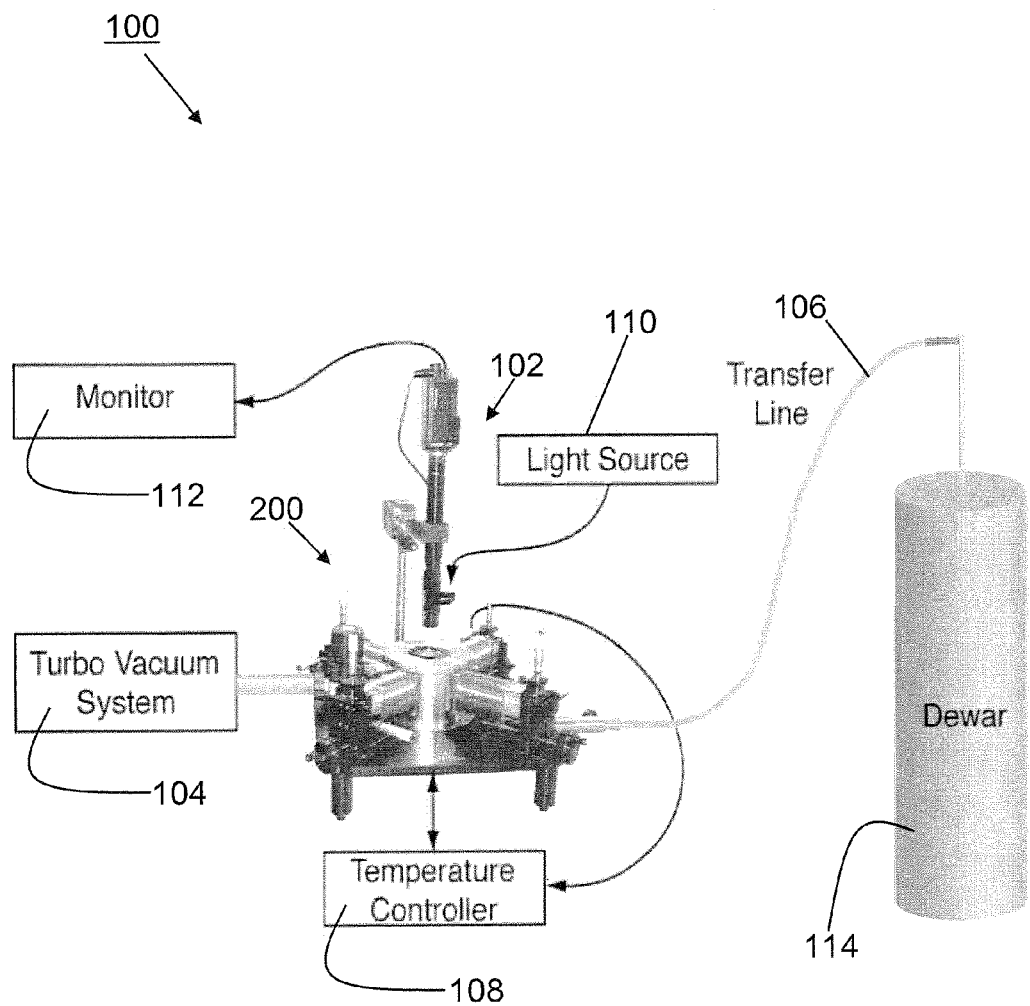
FIG. 1 shows a measuring system, according to an exemplary embodiment.

The TTP4 probe station 200 can be part of a measuring system 100, according to an exemplary embodiment, as shown in FIG. 1. The measuring system 100 includes the TTP4 probe station 200, an optical system 102, a vacuum system 104, a transfer line 106 and a temperature controller 108. The optical system 102 includes a microscope 212, a camera 214, a light source 110 and a monitor 112. The optical system 102 is used to view the sample being tested. The vacuum system 104 is used to evacuate the TTP4 probe station 200 to achieve a vacuum therein. The transfer line 106 carries a cryogen (e.g., liquid helium or liquid nitrogen) from a Dewar 114 to a refrigerator (not shown) in the TTP4 probe station 200. The temperature controller 108 is used to regulate the temperature of the sample. To use the measuring system 100, a sample is placed inside the TTP4 probe station 200, which is then evacuated using the vacuum system 104. The sample is then cooled with the cryogen. Once the sample is at a desired temperature, probe assemblies, such as those described herein, are moved into place on the sample with the aid of the microscope 212, and then measurements of sample properties are made via the probe assemblies.

The TTP4 probe station 200 is a cryogenic micro-manipulated probe station used for non-destructive testing of samples, such as devices on full and partial wafers up to 51 mm (2 in.) in diameter. The TTP4 probe station 200 is a platform for measurement of electrical, electro-optical, parametric, high Z, DC, RF, and microwave properties of materials and test devices. Nanoscale electronics, quantum wires and dots, and semiconductors are typical materials measured in a TTP4 probe station. The TTP4 probe station 200 operates over a temperature range of 4.2 K to 475 K. With options, the base temperature can be extended down to less than 1.5 K.

Figure 2:
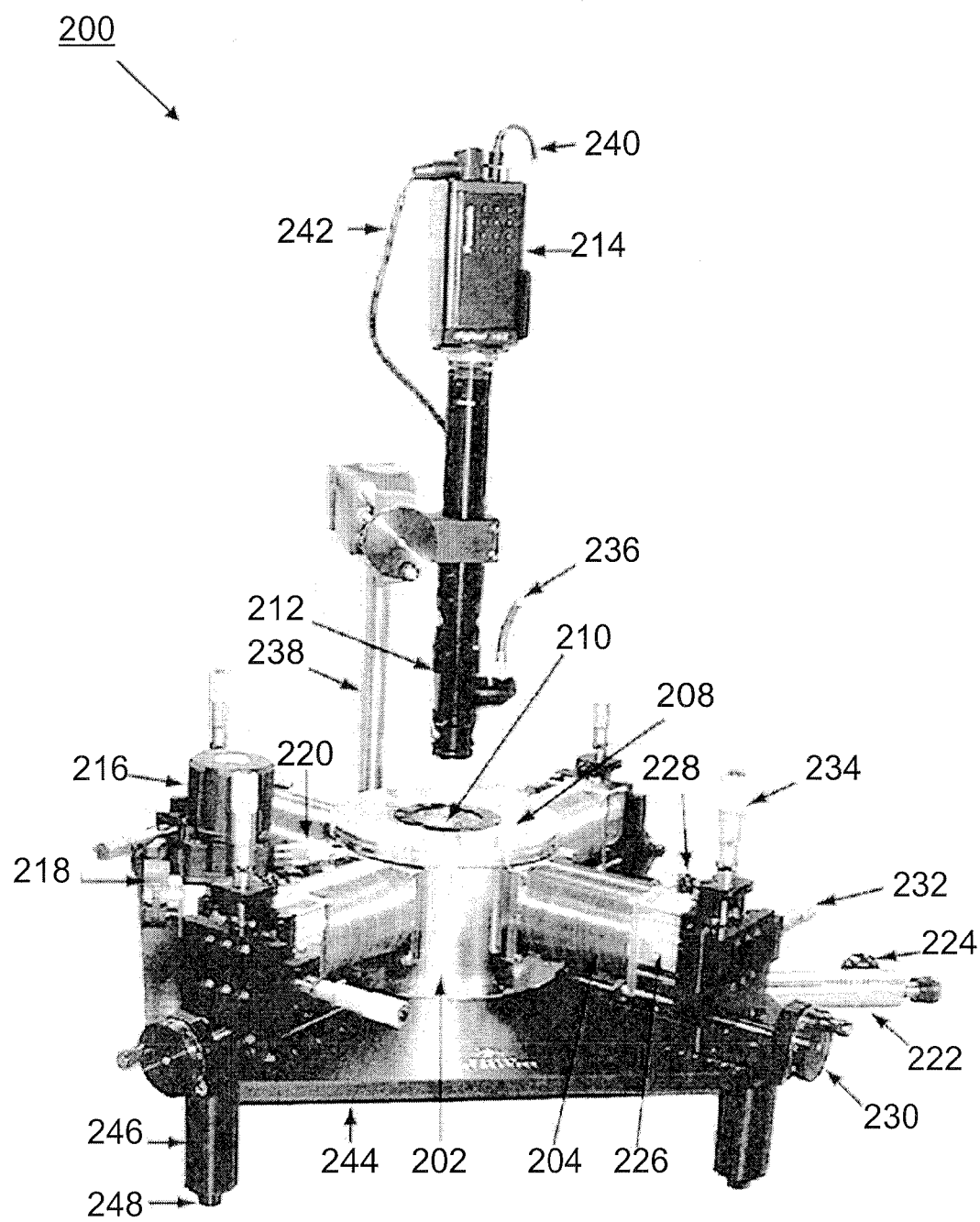
FIG. 2 shows a probe station, according to an exemplary embodiment, for use in the measuring system of FIG. 1.

With reference to FIG. 2, the primary components of the TTP4 probe station 200 are a sealed chamber 202 and bellows 204 to achieve a vacuum, the refrigerator, and four stages, each with a probe arm 206 and a probe assembly, such as probe assembly 400 (see FIG. 4). The probe arms 206 are inside the bellows 204. One of ordinary skill in the art will appreciate that the general inventive concept is applicable to one or more probe assemblies and, thus, stages.

Specifically, the TTP4 probe station 200 includes the chamber 202, a chamber lid 208, a chamber lid viewport 210 and the bellows 204. The chamber 202, in which the refrigerator is situated, holds the sample being measured. The chamber lid 208 seals the chamber 202. The chamber 202 and the bellows 204 are under vacuum once the vacuum system 104 is turned on. The chamber lid viewport 210 allows viewing of the sample either directly or with the microscope 212 and the camera 214.

The TTP4 probe station 200 also includes a vacuum isolation valve 216, a vacuum connection 218, a pressure relief valve 220, a bayonet 222, an exhaust port 224, a feedthrough housing 226 and a signal connector 228. The vacuum isolation valve 216 opens and closes the connection (i.e., the vacuum connection 218) between the TTP4 probe station 200 and the vacuum system 104. The vacuum connection 218 is the interface that connects the vacuum system 104 and the TTP4 probe station 200. As noted above, the vacuum system 104 evacuates the chamber 202 and the areas internal to the bellows 204. The pressure relief valve 220 prevents dangerous pressure build-ups by relieving excess pressure within the TTP4 probe station 200.

The bayonet 222 is a cryogen inlet and exhaust tube. The cryogen is routed from the Dewar 114 to the TTP4 probe station 200 via the transfer line 106, which is inserted into the bayonet 222. The cryogen exits the TTP4 probe station 200 through the exhaust port 224. The exhaust can be recaptured or vented away from the TTP4 probe station 200. In an exemplary embodiment, a vacuum pump can be attached to the exhaust port 224 to further lower the effective temperature of the TTP4 probe station 200, for example, down to approximately 3 K. The feedthrough housing 226 provides the interface between ambient pressure and the internal vacuum. Signal inputs and outputs are passed to the sample through the feedthrough housing 226. Additionally, the signal connector 228 facilitates signals being input to and output from the sample.

The TTP4 probe station 200 further includes an x-axis hand dial 230, a y-axis micrometer 232 and a z-axis micrometer 234 for controlling movement of each probe assembly. The x-axis hand dial 230 controls the in-out movement of the probe assembly. The y-axis micrometer 232 controls the left-right movement of the probe assembly. The z-axis micrometer 234 controls the height of the probe assembly relative to the sample. After the TTP4 probe station 200 reaches the desired temperature, each probe assembly can be manipulated into place using the x-axis hand dial 230, y-axis micrometer 232 and z-axis micrometer 234.

The TTP4 probe station 200 interfaces with the aforementioned optical system 102 including the microscope 212, the camera 214, the light source 110 and the monitor 112. The microscope 212 is used to view the sample. The microscope 212 can be selected, for example, based on its zoom range (e.g., 7:1, 12.5:1, 16:1) and/or resolution (e.g., 5 µm, 2 µm, 1.5 µm). The camera 214 is used to collect and record images from the microscope 212.

The TTP4 probe station 200 also includes a fiber optic cable 236, a microscope vertical post 238, an S-Video cable 240 and a camera power cable 242. The fiber optic cable 236 brings illumination from the light source 110 to the microscope 212. The microscope vertical post 238 supports the microscope 212 above the chamber 202. The S-video cable 240 routes the output of the camera 214 to the monitor 112 for external viewing. The camera power cable 242 is used to supply power from a power source (not shown) to the camera 214.

A body that supports the TTP4 probe station includes a base 244, legs 246 and rubber feet 248. The legs 246 are connected to the base 244. The rubber feet 248 are attached to the legs 246 and contribute to isolating the sample from external vibrations.

Figure 3:
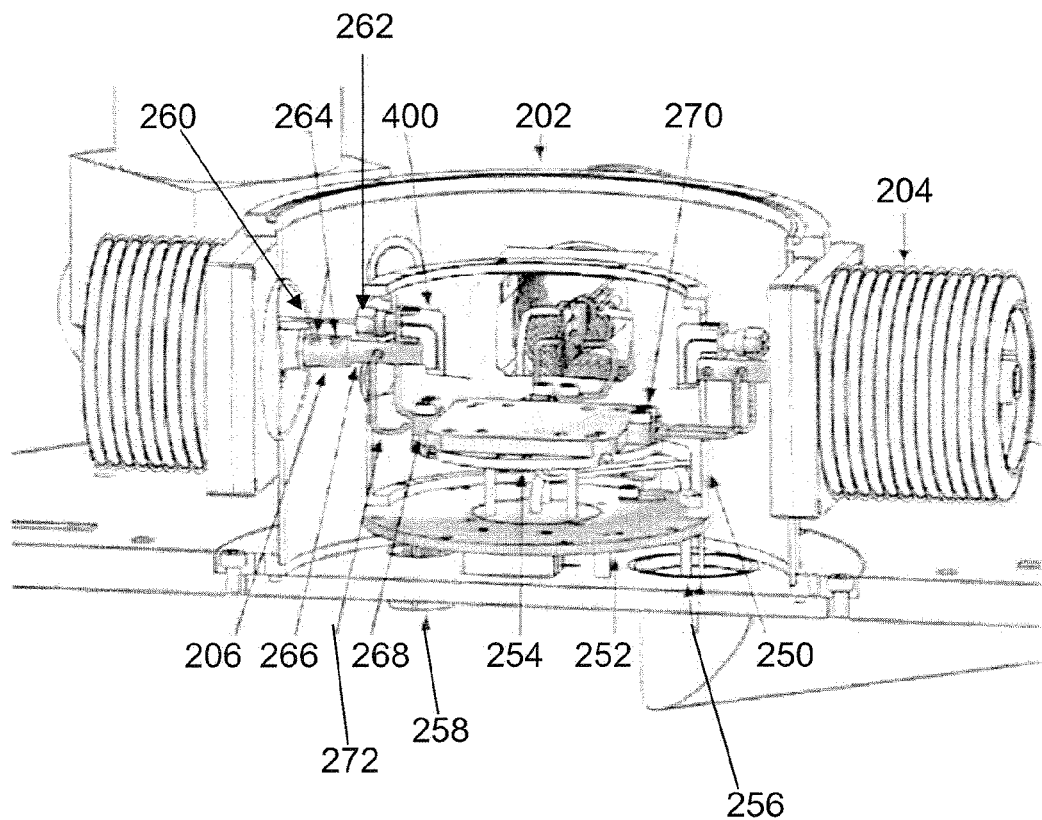
FIG. 3 is a cutaway view of an interior of a chamber and bellows of the probe station of FIG. 2.

FIG. 3 shows a detailed view of an interior of the chamber 202 of the TTP4 probe station 200. Various components are located in or around the chamber 202 including a radiation shield 250, a radiation shield base 252, a cold head 254, cryogen inlet/outlet tubes 256 and a temperature controller feedthrough 258. FIG. 3 also shows the bellows 204, a probe arm 206, a probe arm cable 260, a probe arm connector 262, probe set screws 264, a probe mount or holder 266, a braid block 268, braid block screws 270, a probe braid 272 and the probe assembly 400.

As noted above, the chamber 202 and the bellows 204 are under vacuum once the vacuum system 104 is turned on. The bellows 204 provide structural support around each probe arm 206 when under vacuum. The bellows 204 are formed from stainless steel and are flexible to allow manipulation of the probe assemblies 400 while maintaining the vacuum.

The radiation shield 250 provides thermal radiation shielding within the chamber 202. In an exemplary embodiment, the radiation shield 250 is made of aluminum. The radiation shield base 252 extends above a base 244 of the chamber 202 and supports the radiation shield 250 in the chamber 202. In an exemplary embodiment, the radiation shield base 252 is made of copper. A sample holder (not shown) is connected to the cold head 254. Once the sample is placed in the sample holder, the sample can be cooled by routing the cryogen through the cold head 254. The cryogen enters and exits the chamber 202 through the cryogen inlet/outlet tubes 256.

The temperature of the cold head 254 is regulated through a temperature sensor and heaters (not shown). The temperature sensor is disposed on an underside of the cold head 254. The heaters consist of two cartridge heaters wired in parallel and disposed in cavities in the body of the cold head 254. The temperature sensor output and heater inputs are connected to the temperature controller 108 via the temperature controller feedthrough 258, which is an interface that facilitates connection of the temperature controller 108 to the TTP4 probe station 200.

As shown in FIG. 3, each probe arm 206 enters the radiation shield 250 through an opening therein. The probe mount 266 is attached to the probe arm 206 using the probe set screws 264. The probe mount 266 supports the probe assembly 400 relative to the probe arm 206. In an exemplary embodiment, the probe mount 266 is made of copper.

The braid block 268, which can be made of copper for example, thermally anchors the probe mount 266 to the cold head 254 so that the temperature of the probe assembly 400 is near the temperature of the sample. The braid block screws 270 are used to attach the braid block 268 to the cold head 254. The probe braid 272, which can be made of copper for example, provides the thermal connection between the cold head 254 and the probe mount 266. The probe assembly, such as the probe assembly 400, provides the electrical contact to the sample, as described below.

In operation, the cryogen enters the TTP4 probe station 200 through the bayonet 222. From there it is routed to the bottom of the chamber 202, then into the radiation shield 250 where it cools the cold head 254 and the radiation shield base 252. The cryogen then leaves the radiation shield 250 and bottom of the chamber 202 and is exhausted through the exhaust port 224 on the bayonet 222.

Figure 4A:
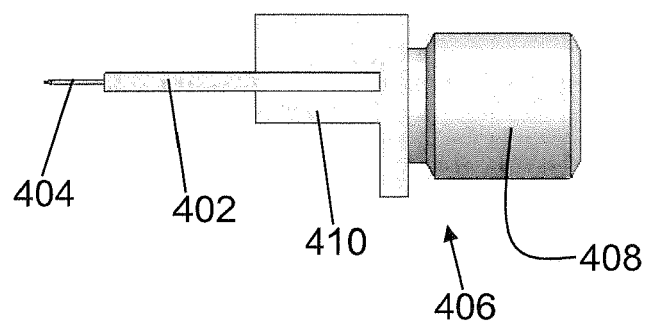
FIGS. 4A and 4B show a conventional probe assembly which can be used in the probe station of FIG. 2.
Figure 4B:
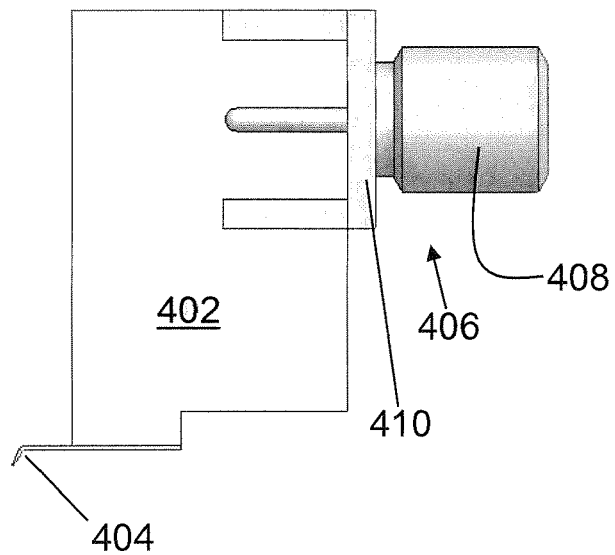

A conventional probe assembly 400 is shown in FIGS. 4A and 4B. The conventional probe assembly 400 can be used in the TTP4 probe station 200. The conventional probe assembly 400 can be used for a wide variety of DC and RF probing measurements, as well as other electrical functions such as voltage biasing or current sourcing when making measurements with other types of probe assemblies. The conventional probe assembly 400 can be used for continuous measurements in the frequency range from DC to 100 MHz. The conventional probes assembly 400 can also be used in selected frequency bands up to 1 GHz.

The conventional probe assembly 400 includes a probe body 402, a probe tip 404 and a connector 406. The connector 406 can be an SMA (SubMiniature version A) connector, which is a coaxial RF connector for interfacing with coaxial cable using a screw type coupling mechanism. The connector 406 includes a threaded portion 408 and a mating portion 410. The threaded portion 408 of the connector 406 can interface with complementary threads on the probe arm connector 262, which electrically connects the probe assembly 400 to the TTP4 probe station 200. The mating portion 410 of the connector 406 is the interface between the connector 406 and the probe body 402.

As seen in FIG. 3, the probe mount 266 supports the probe body 402. The probe tip 404 is connected directly to a lower surface of the probe body 402. The probe tip 404 is the portion of the probe assembly 400 that directly contacts the sample. The probe body 402 conducts signals between the sample (via the probe tip 404) and the probe arm cable 260. Accordingly, it is important that the probe tip 404 remain in contact with the sample. Furthermore, it is also important that the probe tip 404 remain in contact with the sample at the precise location at which the probe tip 404 was originally placed, i.e., the location on the sample that is being measured.

However, as the TTP4 probe station 200 undergoes changes (whether decreases or increases) in temperature, the relatively long probe arm 206 holding the conventional probe assembly 400 contracts or expands in accordance with the coefficient of thermal expansion of the material from which the probe arm 206 is made. This contraction or expansion of the probe arm 206 causes the probe tip 404 to move relative to the sample along one or more of the x, y and z axes. For example, if the probe tip 404 is landed on (i.e., in contact with) a sample being tested while the temperature is varied more than a few Kelvin, the probe arm 206 holding the conventional probe assembly 400 will contract or expand in accordance with the temperature change, thereby causing movement of the probe tip 404 relative to the sample. This unintended movement of the probe tip 404 can result in problems. For example, movement of the probe tip 404 can result in damage to the probe tip 404 and/or the sample being measured. As another example, movement of the probe tip 404 can result in erroneous measurements from the sample being measured. Thus, the conventional probe assembly 400 does not support accurately probing the sample over a full or wide scale temperature range sweep.

To eliminate or otherwise reduce such unintended movement of a probe tip of a probe assembly, the general inventive concepts contemplate a probe assembly that includes one or more resilient members that compensate for the contraction or expansion of the probe arm in accordance with the coefficient of thermal expansion of the material from which the probe arm is made. In this manner, the probe tip can remain in contact with a sample being measured, at the desired location on the sample, during an automated full or wide scale temperature range sweep.

Figure 5A:
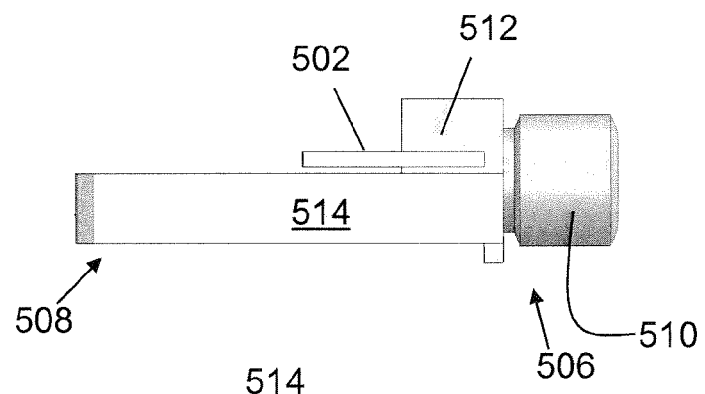
FIGS. 5A and 5B show a probe assembly, according to a first exemplary embodiment, which can be used in the probe station of FIG. 2.
Figure 5B:
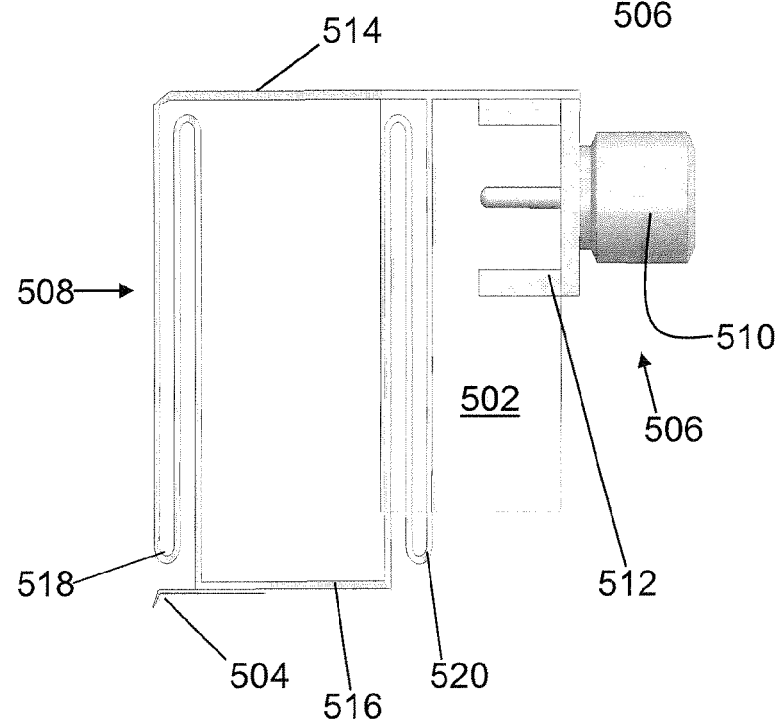

A probe assembly 500, according to a first exemplary embodiment, is shown in FIGS. 5A and 5B. The probe assembly 500 includes a probe body 502, a probe tip 504, an SMA (coaxial RF) connector 506 and a resilient member 508. In an exemplary embodiment, the probe body 502 is a relatively thin, blade-like printed circuit board. The connector 506 includes a threaded portion 510 and a mating portion 512. The threaded portion 510 of the connector 506 can interface with complementary threads on the probe arm connector 262, which electrically connects the probe assembly 500 to the TTP4 probe station 200. The mating portion 512 of the connector 506 is the interface between the connector 506 and the probe body 502. The probe body 502 can be supported by the probe mount 266 and used in the TTP4 probe station 200, as described above.

In an exemplary embodiment, the resilient member 508 is a one-piece structure. The resilient member 508 can be made in any suitable manner and from any suitable materials, such as BeCu. The resilient member 508 extends from the mating portion 512 of the connector 506. The resilient member 508 is adjacent to and parallel to the probe body 502. In an exemplary embodiment, a width of the resilient member 508 is greater than a width of the probe body 502. In an exemplary embodiment, a height of the resilient member 508 is greater than a height of the probe body 502. The resilient member 508 includes a top horizontal bar member 514, a bottom horizontal bar member 516, a first double leaf member 518 and a second double leaf member 520. The top horizontal bar member 514 and the bottom horizontal bar member 516 are substantially parallel to one another. The first double leaf member 518 and the second double leaf member 520 are substantially parallel to one another. The horizontal bar members 514, 516 are substantially perpendicular to the double leaf members 518, 520. The probe tip 504 is connected directly to the bottom horizontal bar member 516 of the resilient member 506.

The resilient member 508 compensates for the expansion or contraction of a probe arm (e.g., the probe arm 206) supporting the probe assembly 500, occurring when the probe arm is subjected to changes in temperature, so that a location of the probe tip 504 remains substantially fixed relative to a sample being measured. Accordingly, the resilient member 508 limits displacement of the probe tip 504 during temperature changes, such as automated full or wide scale temperature range sweeps. In an exemplary embodiment, the resilient member 508 limits displacement of the probe tip 504 over a full or wide scale temperature range. By way of example, the temperature range could be 1.5 K to 475 K, 3.0 K to 475 K or 4.2 K to 475 K.

In the probe assembly 500 of the first exemplary embodiment, the resilient member 508 limits displacement of the probe tip 504 in one or more of the x-axis, y-axis and z-axis directions, during temperature changes that would otherwise cause the probe tip 504 to be significantly displaced relative to the sample being measured. In an exemplary embodiment, the resilient member 508 limits displacement of the probe tip 504 over a temperature range spanning more than a few K, such as a range spanning 10 or more K. In an exemplary embodiment, the resilient member 508 limits displacement of the probe tip 504 on the sample to less than 5 µm.

Figure 6A:
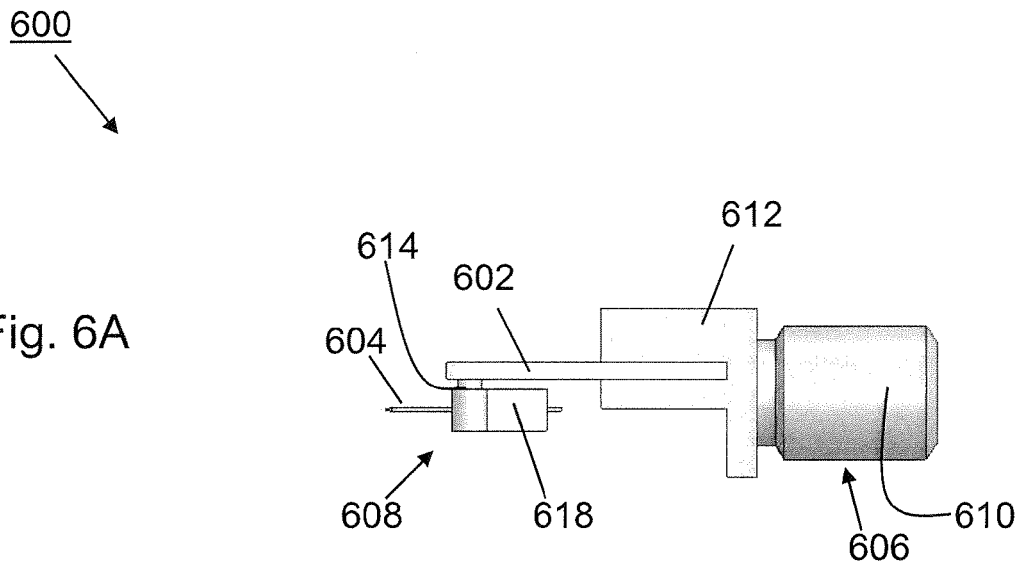
FIGS. 6A and 6B show a probe assembly, according to a second exemplary embodiment, which can be used in the probe station of FIG. 2.
Figure 6B:
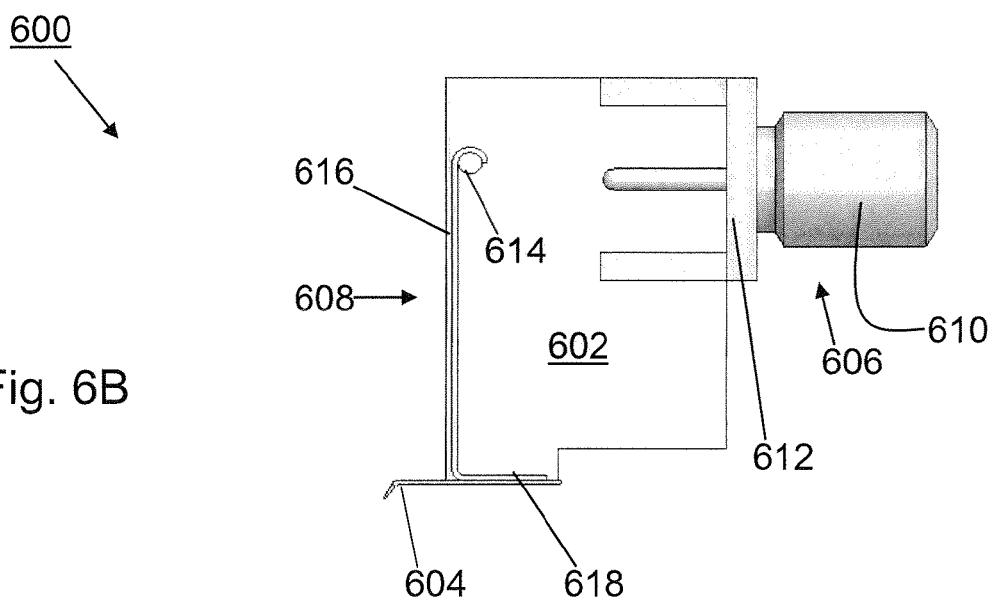

A probe assembly 600, according to a second exemplary embodiment, is shown in FIGS. 6A and 6B. The probe assembly 600 includes a probe body 602, a probe tip 604, an SMA (coaxial RF) connector 606 and a resilient member 608. In an exemplary embodiment, the probe body 602 is a relatively thin, blade-like printed circuit board. The connector 606 includes a threaded portion 610 and a mating portion 612. The threaded portion 610 of the connector 606 can interface with complementary threads on the probe arm connector 262, which electrically connects the probe assembly 600 to the TTP4 probe station 200. The mating portion 612 of the connector 606 is the interface between the connector 606 and the probe body 602. The probe body 602 can be supported by the probe mount 266 and used in the TTP4 probe station 200, as described above.

In an exemplary embodiment, the resilient member 608 is a one-piece structure. The resilient member 608 can be made in any suitable manner and from any suitable materials, such as BeCu. The resilient member 608 does not contact the mating portion 612 of the connector 606. Instead, the resilient member 608 is connected to a post 614 extending from and perpendicular to the probe body 602. According to this arrangement, the resilient member 608 is adjacent to and parallel to the probe body 602. In an exemplary embodiment, a width of the resilient member 608 is greater than a width of the probe body 602. The resilient member 608 includes a vertical bar member 616 and a horizontal bar member 618. Accordingly, the probe assembly 600 presents a relatively simple design, thereby avoiding manufacturing difficulties that may arise with more complex designs. In an exemplary embodiment, a length of the vertical bar member 616 is greater than a length of the horizontal bar member 618. The vertical bar member 616 and the horizontal bar member 618 are substantially perpendicular to one another. The vertical bar member 616 connects to the post 614 extending from the probe body 602. The probe tip 604 is connected directly to the horizontal bar member 618 of the resilient member 608.

The resilient member 608 compensates for the expansion or contraction of a probe arm (e.g., the probe arm 206) supporting the probe assembly 600, occurring when the probe arm is subjected to changes in temperature, so that a location of the probe tip 604 remains substantially fixed relative to a sample being measured. Accordingly, the resilient member 608 limits displacement of the probe tip 604 during temperature changes, such as automated full or wide scale temperature range sweeps. In an exemplary embodiment, the resilient member 608 limits displacement of the probe tip 604 over a full or wide scale temperature range. By way of example, the temperature range could be 1.5 K to 475 K, 3.0 K to 475 K or 4.2 K to 475 K.

In the probe assembly 600 of the second exemplary embodiment, the resilient member 608 limits displacement of the probe tip 604 in one or more of the x-axis, y-axis and z-axis directions, during temperature changes that would otherwise cause the probe tip 604 to be significantly displaced relative to the sample being measured. In an exemplary embodiment, the resilient member 608 limits displacement of the probe tip 604 over a temperature range spanning more than a few K, such as a range spanning 10 or more K. In an exemplary embodiment, the resilient member 608 limits displacement of the probe tip 604 on the sample to less than 5 µm.

A probe assembly 700, according to a third exemplary embodiment, is shown in FIGS. 7A and 7B. The probe assembly 700 includes a probe body 702, a probe tip 704, an SMA (coaxial RF) connector 706 and a resilient member 708. In an exemplary embodiment, the probe body 702 is a relatively thin, blade-like printed circuit board. The connector 706 includes a threaded portion 710 and a mating portion 712. The threaded portion 710 of the connector 706 can interface with complementary threads on the probe arm connector 262, which electrically connects the probe assembly 700 to the TTP4 probe station 200. The mating portion 712 of the connector 706 is the interface between the connector 706 and the probe body 702. The probe body 702 can be supported by the probe mount 266 and used in the TTP4 probe station 200, as described above.

In an exemplary embodiment, the resilient member 708 is a one-piece structure. The resilient member 708 can be made in any suitable manner and from any suitable materials, such as BeCu. The resilient member 708 does not contact the mating portion 712 of the connector 706. Instead, the resilient member 708 is connected to a post 714 extending from and perpendicular to the probe body 702. According to this arrangement, the resilient member 708 is adjacent to and parallel to the probe body 702. In an exemplary embodiment, a width of the resilient member 708 is greater than a width of the probe body 702. The resilient member 708 includes a double leaf member 716 and a horizontal bar member 718. The straight portions of the double leaf member 616 and the horizontal bar member 718 are substantially perpendicular to one another. The double leaf member 716 connects to the post 714 extending from the probe body 702. The probe tip 704 is connected directly to the horizontal bar member 718 of the resilient member 708.

The resilient member 708 compensates for the expansion or contraction of a probe arm (e.g., the probe aim 206) supporting the probe assembly 700, occurring when the probe arm is subjected to changes in temperature, so that a location of the probe tip 704 remains substantially fixed relative to a sample being measured. Accordingly, the resilient member 708 limits displacement of the probe tip 704 during temperature changes, such as automated full or wide scale temperature range sweeps. In an exemplary embodiment, the resilient member 708 limits displacement of the probe tip 704 over a full or wide scale temperature range. By way of example, the temperature range could be 1.5 K to 475 K, 3.0 K to 475 K or 4.2 K to 475 K.

In the probe assembly 700 of the third exemplary embodiment, the resilient member 708 limits displacement of the probe tip 704 in one or more of the x-axis, y-axis and z-axis directions, during temperature changes that would otherwise cause the probe tip 704 to be significantly displaced relative to the sample being measured. In an exemplary embodiment, the resilient member 708 limits displacement of the probe tip 704 over a temperature range spanning more than a few K, such as a range spanning 10 or more K. In an exemplary embodiment, the resilient member 708 limits displacement of the probe tip 704 on the sample to less than 5 µm.

Figure 8A:
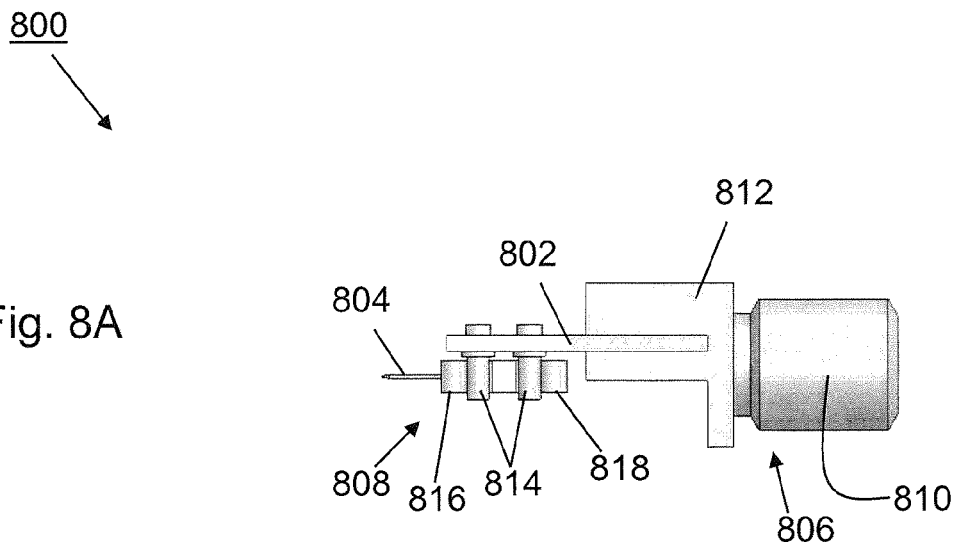
FIGS. 8A and 8B show a probe assembly, according to a fourth exemplary embodiment, which can be used in the probe station of FIG. 2.
Figure 8B:
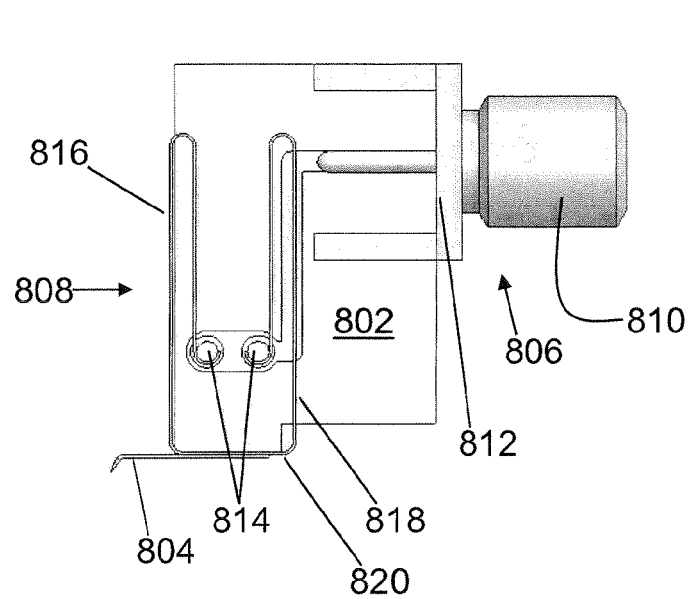

A probe assembly 800, according to a fourth exemplary embodiment, is shown in FIGS. 8A and 8B. The probe assembly 800 includes a probe body 802, a probe tip 804, an SMA (coaxial RF) connector 806 and a resilient member 808. In an exemplary embodiment, the probe body 802 is a relatively thin, blade-like printed circuit board. The connector 806 includes a threaded portion 810 and a mating portion 812. The threaded portion 810 of the connector 806 can interface with complementary threads on the probe arm connector 262, which electrically connects the probe assembly 800 to the TTP4 probe station 200. The mating portion 812 of the connector 806 is the interface between the connector 806 and the probe body 802. The probe body 802 can be supported by the probe mount 266 and used in the TTP4 probe station 200, as described above.

In an exemplary embodiment, the resilient member 808 is a one-piece structure. The resilient member can be made in any suitable manner and from any suitable materials, such as BeCu. The resilient member 808 does not contact the mating portion 812 of the connector 806. Instead, the resilient member 808 is connected to a pair of posts 814 extending from and perpendicular to the probe body 802. According to this arrangement, the resilient member 808 is adjacent to and parallel to the probe body 802. In an exemplary embodiment, a width of the resilient member 808 is greater than a width of the probe body 802. The resilient member 808 includes a first leaf member 816 and a second leaf member 818. The leaf members 816, 818 are joined by a horizontal bar member 820. The straight portions of the leaf members 816, 818 and the horizontal bar member 820 are substantially perpendicular to one another. Each of the leaf members 816 and 818 connect to a corresponding one of the posts 814 extending from the probe body 802. The probe tip 804 is connected directly to the horizontal bar member 820 of the resilient member 808.

The resilient member 808 compensates for the expansion or contraction of a probe arm (e.g., the probe arm 206) supporting the probe assembly 800, occurring when the probe arm is subjected to changes in temperature, so that a location of the probe tip 804 remains substantially fixed relative to a sample being measured. Accordingly, the resilient member 808 limits displacement of the probe tip 804 during temperature changes, such as automated full or wide scale temperature range sweeps. In an exemplary embodiment, the resilient member 808 limits displacement of the probe tip 804 over a full or wide scale temperature range. By way of example, the temperature range could be 1.5 K to 475 K, 3.0 K to 475 K or 4.2 K to 475 K.

In the probe assembly 800 of the fourth exemplary embodiment, the resilient member 808 limits displacement of the probe tip 804 in one or more of the x-axis, y-axis and z-axis directions, during temperature changes that would otherwise cause the probe tip 804 to be significantly displaced relative to the sample being measured. In an exemplary embodiment, the resilient member 808 limits displacement of the probe tip 804 over a temperature range spanning more than a few K, such as a range spanning 10 or more K. In an exemplary embodiment, the resilient member 808 limits displacement of the probe tip 804 on the sample to less than 5 µm.

Figure 9A:
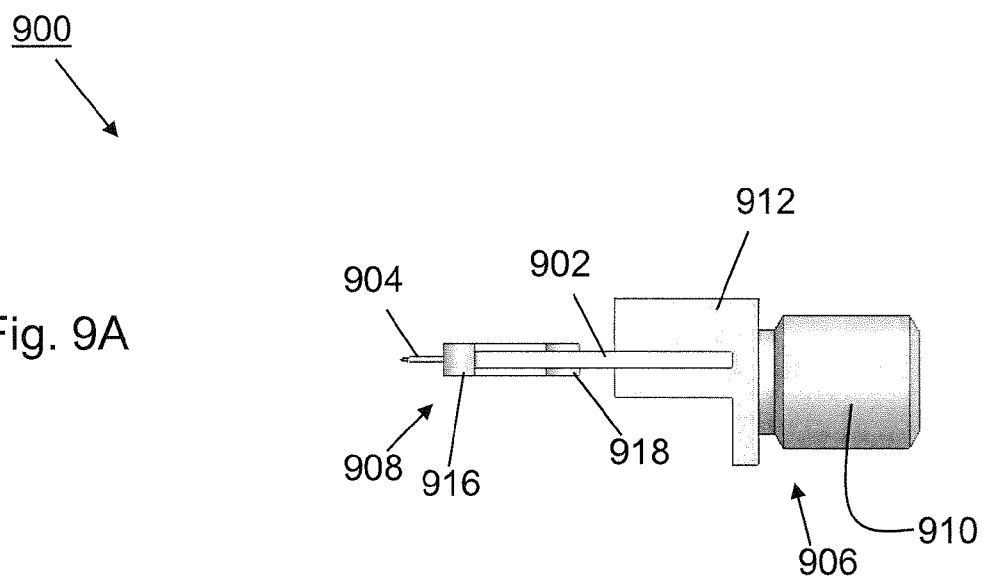
FIGS. 9A and 9B show a probe assembly, according to a fifth exemplary embodiment, which can be used in the probe station of FIG. 2.
Figure 9B:
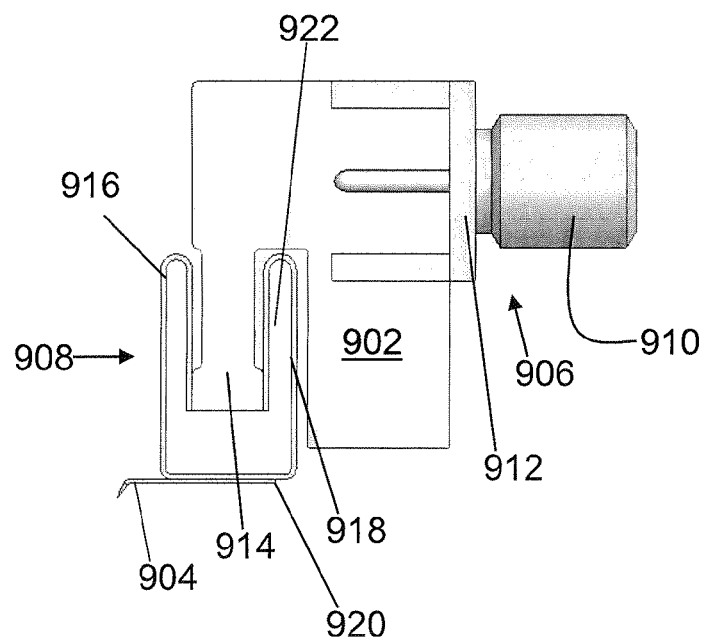

A probe assembly 900, according to a fifth exemplary embodiment, is shown in FIGS. 9A and 9B. The probe assembly 900 includes a probe body 902, a probe tip 904, an SMA (coaxial RF) connector 906 and a resilient member 908. In an exemplary embodiment, the probe body 902 is a relatively thin, blade-like printed circuit board. The connector 906 includes a threaded portion 910 and a mating portion 912. The threaded portion 910 of the connector 906 can interface with complementary threads on the probe arm connector 262, which electrically connects the probe assembly 900 to the TTP4 probe station 200. The mating portion 912 of the connector 906 is the interface between the connector 906 and the probe body 902. The probe body 902 can be supported by the probe mount 266 and used in the TTP4 probe station 200, as described above.

Figure 12A:
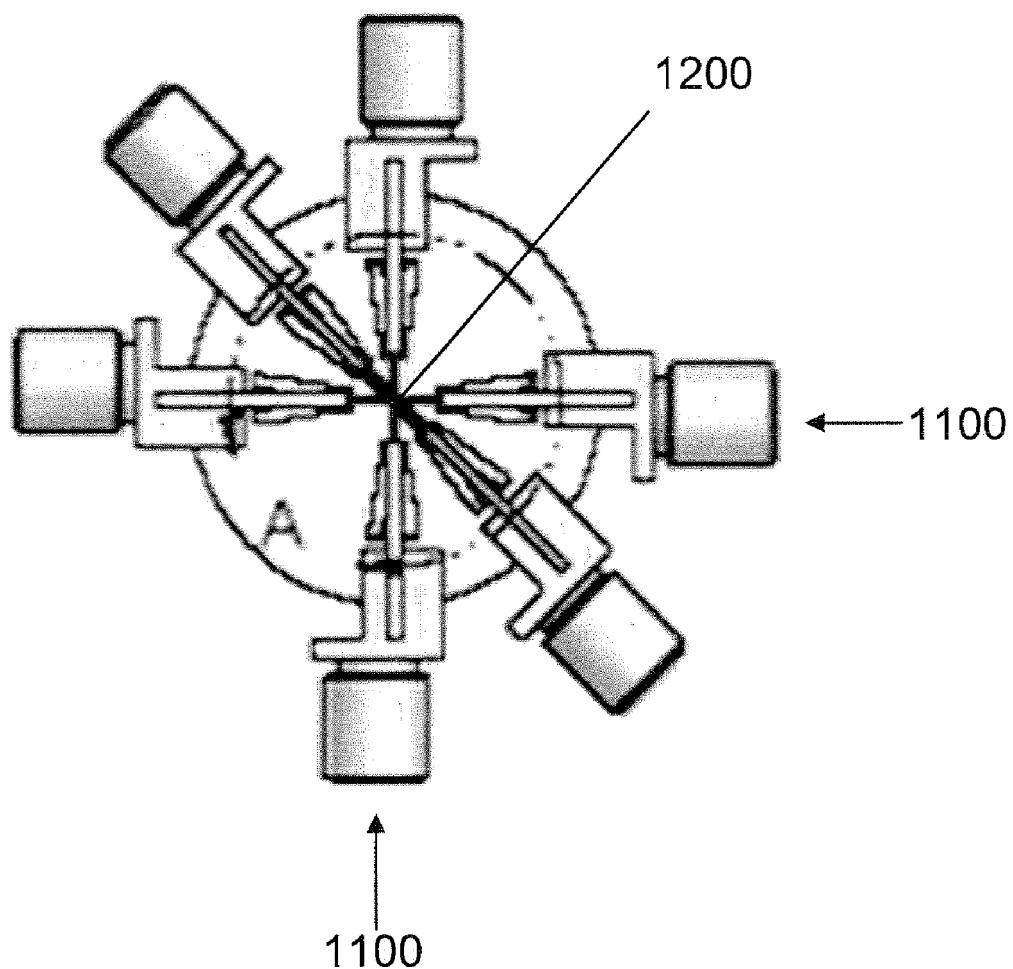
FIGS. 12A and 12B show multiple instances of the probe assembly of FIG. 11, wherein the probe tips of the probe assemblies contact a single point on a sample being measured.
Figure 12B:
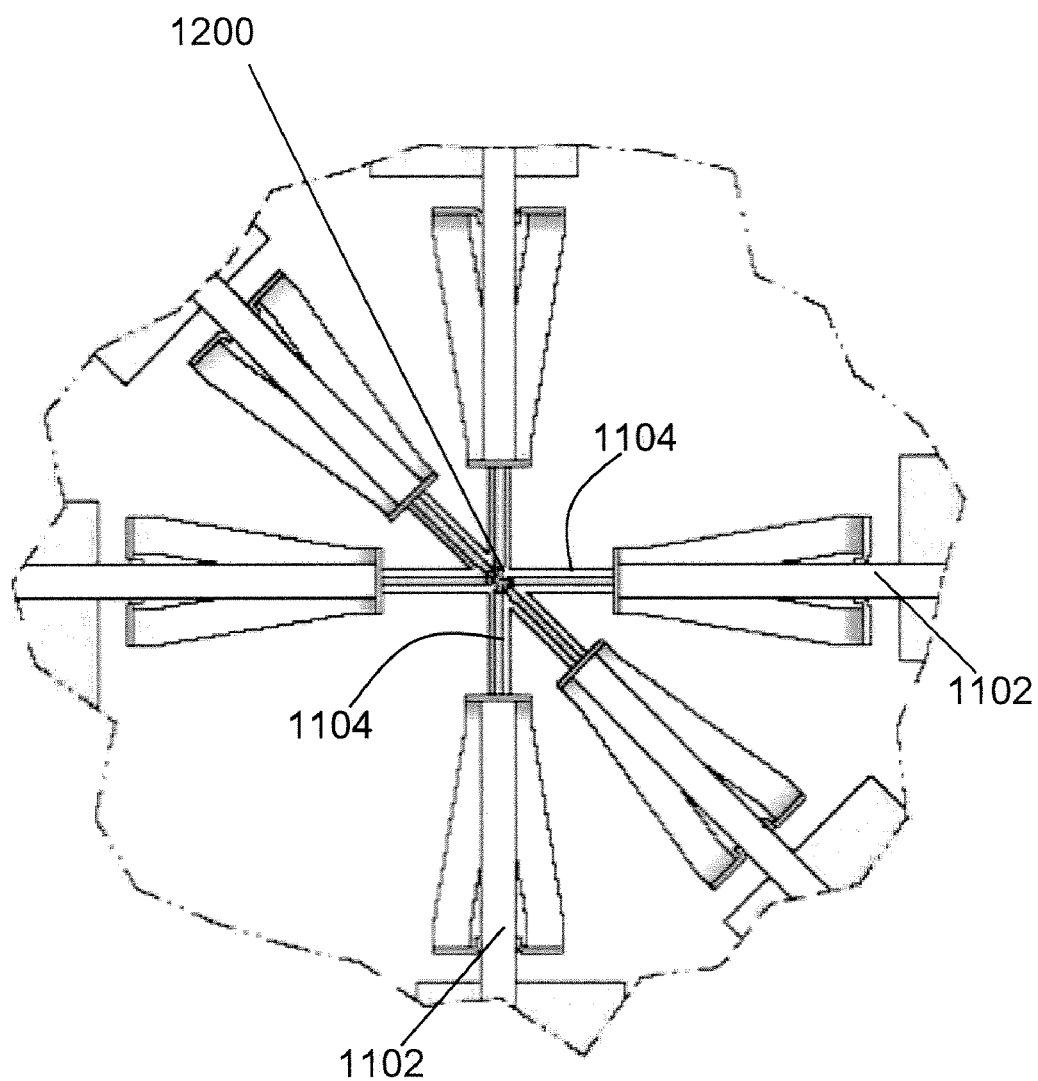

In an exemplary embodiment, the resilient member 908 is a one-piece structure. The resilient member 908 can be made in any suitable manner and from any suitable materials, such as BeCu. The resilient member 908 does not contact the mating portion 912 of the connector 806. Instead, the resilient member 908 is disposed in alignment with the probe body 902 and connected directly to a flange 914 formed therein. According to this arrangement, probe tips 904 of a plurality of the probe assemblies 900 can be made to touch the same point or location (e.g., point 1200) on the sample being measured within the TTP4 probe station 200, as shown in FIGS. 12A and 12B. The resilient member 908 includes a first leaf member 916 and a second leaf member 918. The leaf members 916, 918 are joined by a horizontal bar member 920. The straight portions of the leaf members 916, 918 and the horizontal bar member 920 are substantially perpendicular to one another. Each of the leaf members 916 and 918 connect directly to the flange 914 of the probe body 902. At least a portion of the second leaf member 918 is located in a recess 922 fowled in the probe body 902. The probe tip 904 is connected directly to the horizontal bar member 920 of the resilient member 908.

The resilient member 908 compensates for the expansion or contraction of a probe arm (e.g., the probe arm 206) supporting the probe assembly 900, occurring when the probe arm is subjected to changes in temperature, so that a location of the probe tip 904 remains substantially fixed relative to a sample being measured. Accordingly, the resilient member 908 limits displacement of the probe tip 904 during temperature changes, such as automated full or wide scale temperature range sweeps. In an exemplary embodiment, the resilient member 908 limits displacement of the probe tip 904 over a full or wide scale temperature range. By way of example, the temperature range could be 1.5 K to 475 K, 3.0 K to 475 K or 4.2 K to 475 K.

In the probe assembly 900 of the fifth exemplary embodiment, the resilient member 908 limits displacement of the probe tip 904 in one or more of the x-axis, y-axis and z-axis directions, during temperature changes that would otherwise cause the probe tip 904 to be significantly displaced relative to the sample being measured. In an exemplary embodiment, the resilient member 908 limits displacement of the probe tip 904 over a temperature range spanning more than a few K, such as a range spanning 10 or more K. In an exemplary embodiment, the resilient member 908 limits displacement of the probe tip 904 on the sample to less than 5 µm.

Figure 10A:
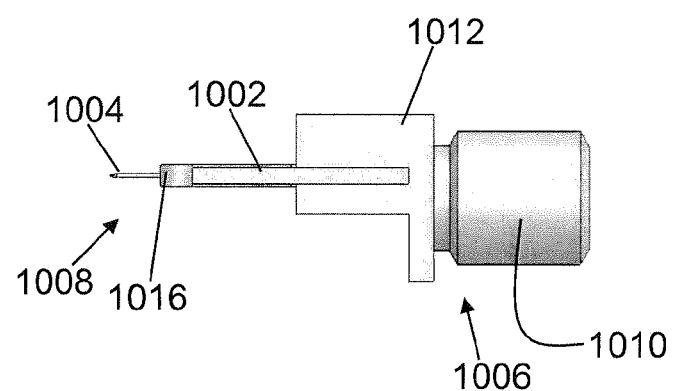
FIGS. 10A and 10B show a probe assembly, according to a sixth exemplary embodiment, which can be used in the probe station of FIG. 2.
Figure 10B:
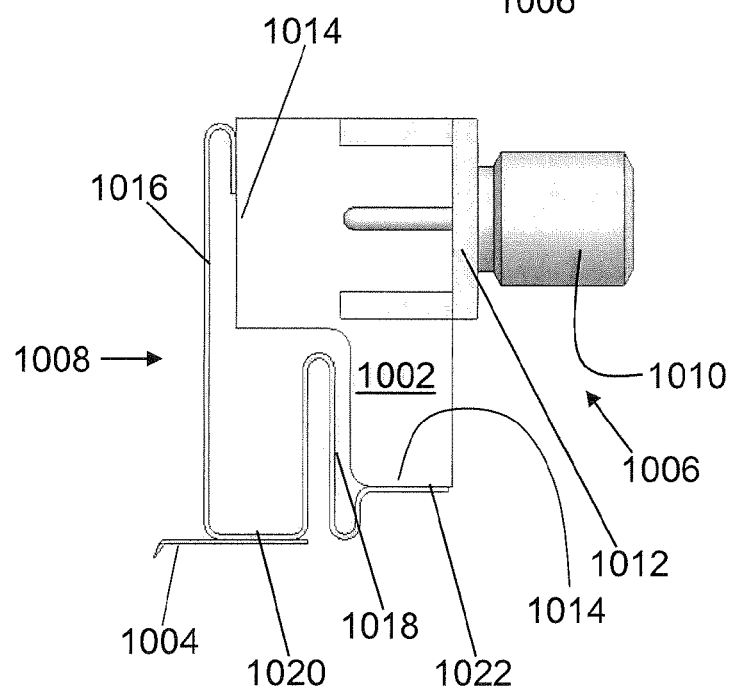

A probe assembly 1000, according to a sixth exemplary embodiment, is shown in FIGS. 10A and 10B. The probe assembly 1000 includes a probe body 1002, a probe tip 1004, an SMA (coaxial RF) connector 1006 and a resilient member 1008. In an exemplary embodiment, the probe body 1002 is a relatively thin, blade-like printed circuit board. The connector 1006 includes a threaded portion 1010 and a mating portion 1012. The threaded portion 1010 of the connector 1006 can interface with complementary threads on the probe arm connector 262, which electrically connects the probe assembly 1000 to the TTP4 probe station 200. The mating portion 1012 of the connector 1006 is the interface between the connector 1006 and the probe body 1002. The probe body 1002 can be supported by the probe mount 266 and used in the TTP4 probe station 200, as described above.

In an exemplary embodiment, the resilient member 1008 is a one-piece structure. The resilient member 1008 can be made in any suitable manner and from any suitable material, such as BeCu. The resilient member 1008 does not contact the mating portion 1012 of the connector 1006. Instead, the resilient member 1008 is disposed in alignment with the probe body 1002 and connected directly to side surfaces 1014 of the probe body 1002. According to this arrangement, probe tips 1004 of a plurality of the probe assemblies 1000 can be made to touch the same point or location (e.g., point 1200) on the sample being measured within the TTP4 probe station 200, as shown in FIGS. 12A and 12B. The resilient member 1008 includes a leaf member 1016 and a double leaf member 1018. In an exemplary embodiment, a height of the leaf member 1016 is greater than a height of the double leaf member 1018. The leaf member 1016 and the double leaf member 1018 are joined by a first horizontal bar member 1020. The straight portions of the leaf members 1016, 1018 and the first horizontal bar member 1020 are substantially perpendicular to one another. A second horizontal bar member 1022 extends from the double leaf member 1018 and does not contact the leaf member 1016. The straight portions of the leaf members 1016, 1018 and the second horizontal bar member 1020 are substantially perpendicular to one another. The leaf member 1016 and the second horizontal bar member 1022 connect directly to the probe body 1002. The probe tip 1004 is connected directly to the first horizontal bar member 1020 of the resilient member 1008.

The resilient member 1008 compensates for the expansion or contraction of a probe arm (e.g., the probe arm 206) supporting the probe assembly 1000, occurring when the probe arm is subjected to changes in temperature, so that a location of the probe tip 1004 remains substantially fixed relative to a sample being measured. Accordingly, the resilient member 1008 limits displacement of the probe tip 1004 during temperature changes, such as automated full or wide scale temperature range sweeps. In an exemplary embodiment, the resilient member 1008 limits displacement of the probe tip 1004 over a full or wide scale temperature range. By way of example, the temperature range could be 1.5 K to 475 K, 3.0 K to 475 K or 4.2 K to 475 K.

In the probe assembly 1000 of the sixth exemplary embodiment, the resilient member 1008 limits displacement of the probe tip 1004 in one or more of the x-axis, y-axis and z-axis directions, during temperature changes that would otherwise cause the probe tip 1004 to be significantly displaced relative to the sample being measured. In an exemplary embodiment, the resilient member 1008 limits displacement of the probe tip 1004 over a temperature range spanning more than a few K, such as a range spanning 10 or more K. In an exemplary embodiment, the resilient member 1008 limits displacement of the probe tip 1004 on the sample to less than 5 µm.

Figure 11A:
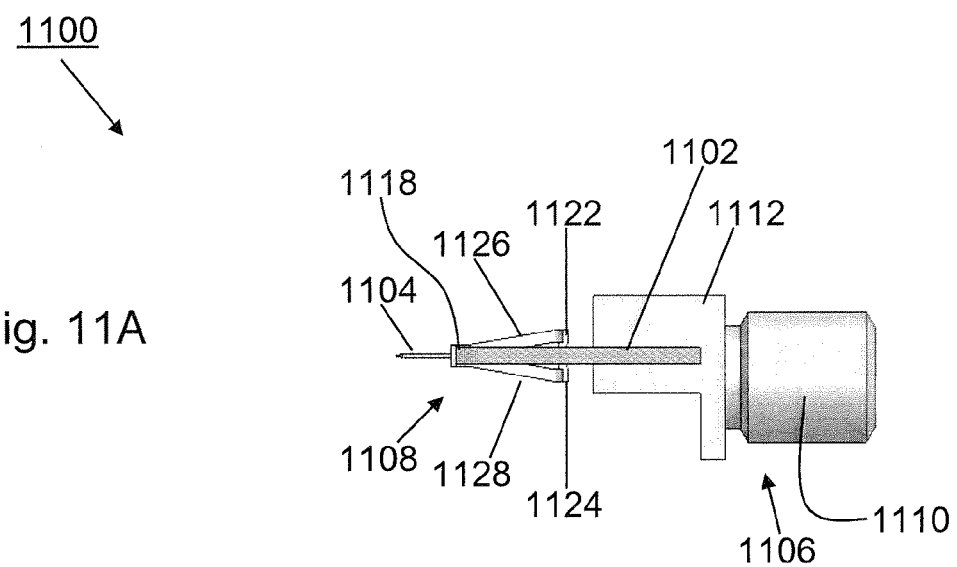
FIGS. 11A, 11B, 11C, 11D, 11E and 11F show a probe assembly, according to a seventh exemplary embodiment, which can be used in the probe station of FIG. 2.
Figure 11B:
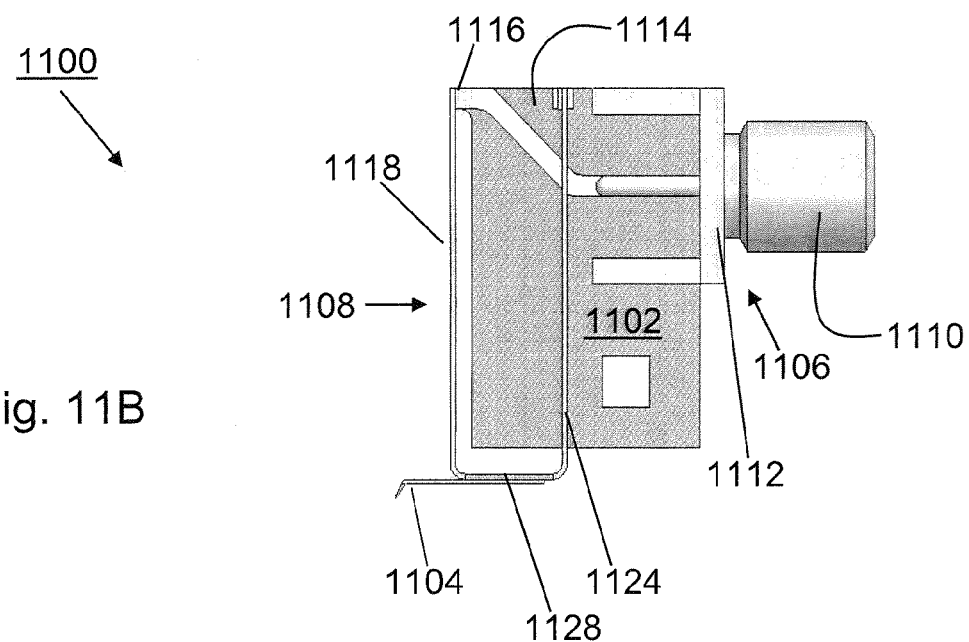
Figure 11C:
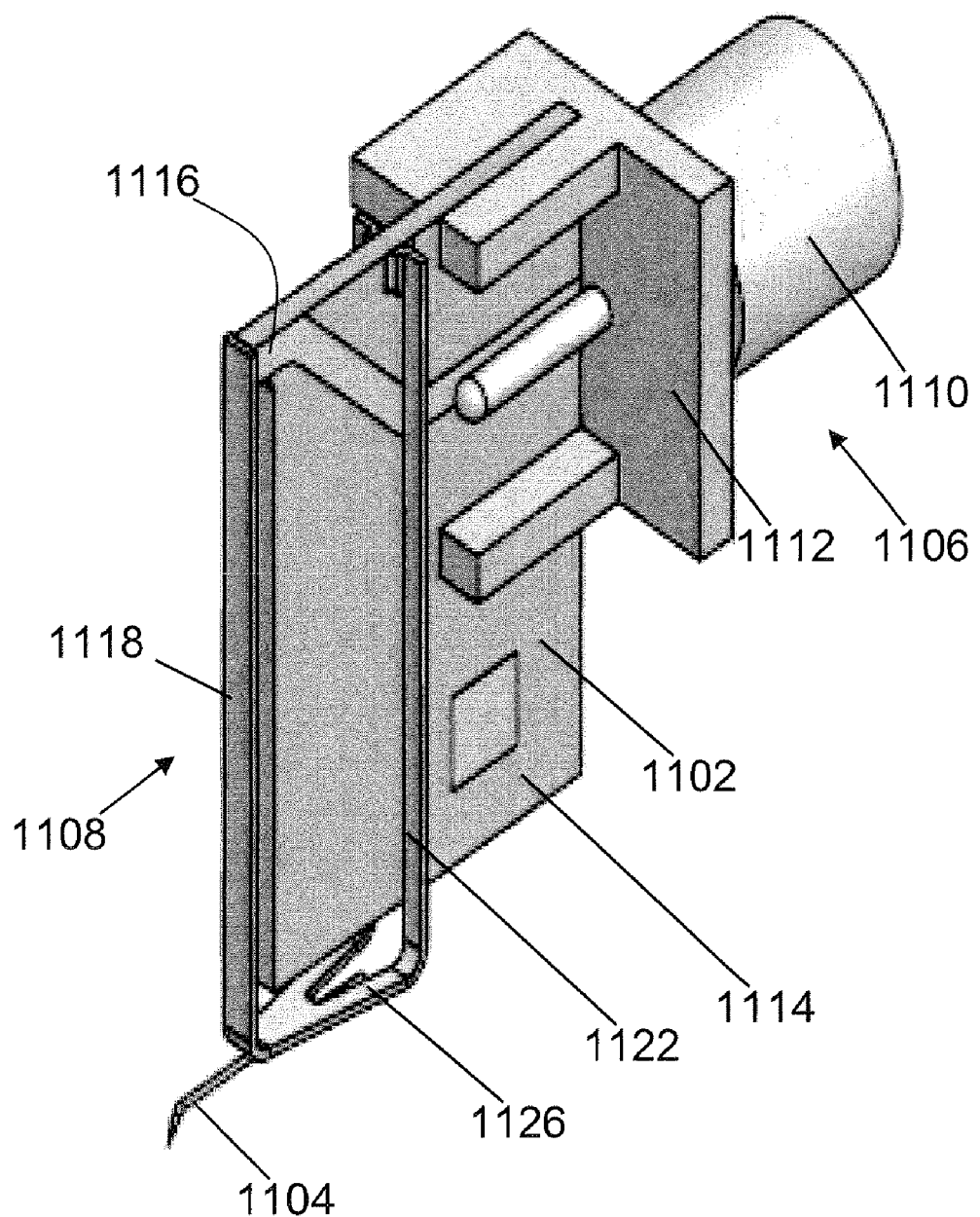
Figure 11D:
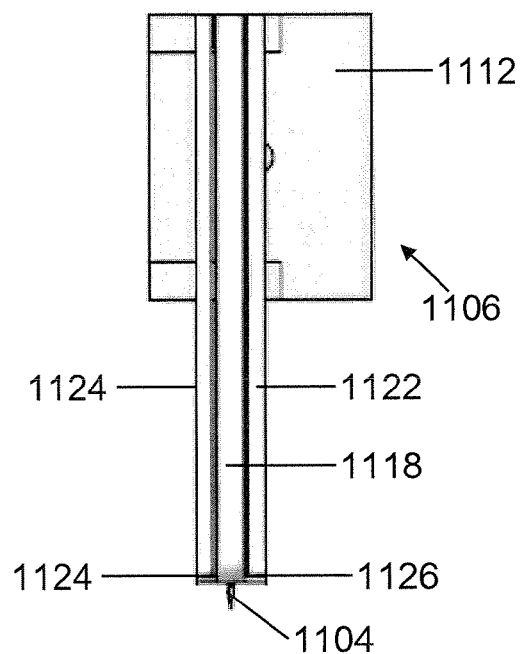
Figure 11E:
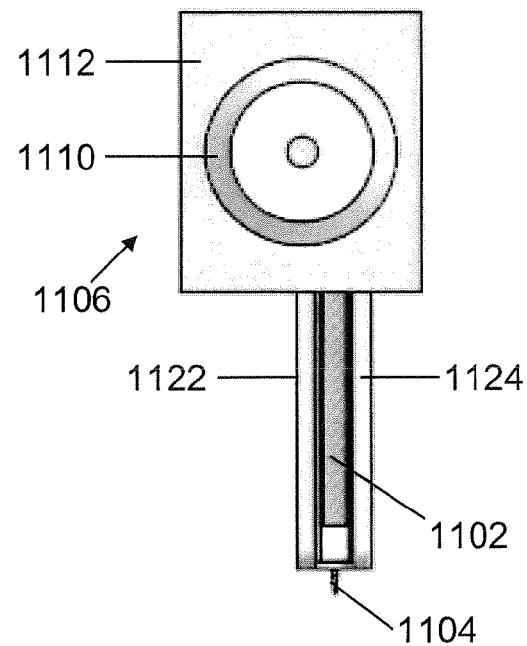
Figure 11F:
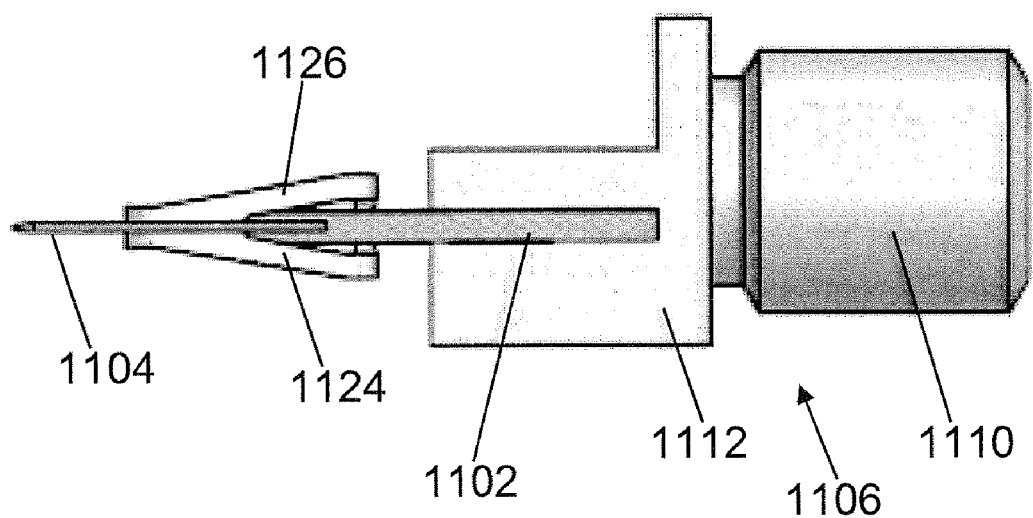

A probe assembly 1100, according to a seventh exemplary embodiment, is shown in FIGS. 11A and 11B. The probe assembly 1100 includes a probe body 1102, a probe tip 1104, an SMA (coaxial RF) connector 1106 and a resilient member 1108. In an exemplary embodiment, the probe body 1102 is a relatively thin, blade-like printed circuit board. The connector 1106 includes a threaded portion 1110 and a mating portion 1112. The threaded portion 1110 of the connector 1106 can interface with complementary threads on the probe arm connector 262, which electrically connects the probe assembly 1100 to the TTP4 probe station 200. The mating portion 1112 of the connector 1106 is the interface between the connector 1106 and the probe body 1102. The probe body 1102 can be supported by the probe mount 266 and used in the TTP4 probe station 200, as described above.

In an exemplary embodiment, the resilient member 1108 is a one-piece structure. The resilient member 1108 can be made in any suitable manner and from any suitable materials, such as BeCu. In an exemplary embodiment, a photochemical etching process is used to produce a flat strip which is then bent into the desired shape for the resilient member 1108 and then soldered to the probe body 1102. Thereafter, the probe tip 1104 is soldered onto the formed resilient member 1108. Thus, the probe assembly 1100 presents a design that can be easily and efficiently manufactured.

The resilient member 1108 does not contact the mating portion 1112 of the connector 1106. Instead, the resilient member 1108 is disposed in alignment with the probe body 1102 and connected directly to side surfaces 1114 of the probe body 1102 and a lip portion 1116 formed on the probe body 1102. According to this arrangement, probe tips 1104 of a plurality of the probe assemblies 1100 can be made to touch the same point or location (e.g., point 1200) on the sample being measured within the TTP4 probe station 200, as shown in FIGS. 12A and 12B.

The resilient member 1108 includes a first vertical bar member 1118, a second vertical bar member 1120 and a third vertical bar member 1122. In an exemplary embodiment, a height of the first vertical bar member 1118, the second vertical bar member 1120 and the third vertical bar member 1122 is substantially the same. The first vertical bar member 1118 and the second vertical bar member 1120 are joined by a first angled horizontal bar member 1124. The first vertical bar member 1118 and the third vertical bar member 1122 are joined by a second angled horizontal bar member 1126. The vertical bar members 1118, 1120 and 1122 and the angled horizontal bar members 1124, 1126 are substantially perpendicular to one another. The first angled horizontal bar member 1124 and the second angled horizontal bar member 1126 are integrated with one another near a bottom of the first vertical bar member 1118 (see FIG. 10C). The first vertical bar member 1118 is connected directly to the lip portion 1116 of the probe body 1102. The second vertical bar member 1120 and the third vertical bar member 1122 are connected directly to opposite side surfaces 1114 of the probe body 1102. The probe tip 1104 is connected directly to the angled horizontal bar members 1124, 1126. In an exemplary embodiment, a height of the resilient member 1108 is greater than a height of the probe body 1102.

The resilient member 1108 compensates for the expansion or contraction of a probe arm (e.g., the probe arm 206) supporting the probe assembly 1100, occurring when the probe arm is subjected to changes in temperature, so that a location of the probe tip 1104 remains substantially fixed relative to a sample being measured. Accordingly, the resilient member 1108 limits displacement of the probe tip 1104 during temperature changes, such as automated full or wide scale temperature range sweeps. In an exemplary embodiment, the resilient member 1108 limits displacement of the probe tip 1104 over a full or wide scale temperature range. By way of example, the temperature range could be 1.5 K to 475 K, 3.0 K to 475 K or 4.2 K to 475 K.

In the probe assembly 1100 of the seventh exemplary embodiment, the resilient member 1108 limits displacement of the probe tip 1104 in one or more of the x-axis, y-axis and z-axis directions, during temperature changes that would otherwise cause the probe tip 1104 to be significantly displaced relative to the sample being measured. In an exemplary embodiment, the resilient member 1108 limits displacement of the probe tip 1104 over a temperature range spanning more than a few K, such as a range spanning 10 or more K. In an exemplary embodiment, the resilient member 1108 limits displacement of the probe tip 1104 on the sample to less than 5 μm.

The above description of specific embodiments has been given by way of example. From the disclosure given, those skilled in the art will not only understand the general inventive concepts and their attendant advantages, but will also find apparent various changes and modifications to the structures and methods disclosed. For example, one of ordinary skill in the art will appreciate that the physical dimensions and/or geometries of the resilient members disclosed herein may be varied to achieve differing levels of compensation for movement of the probe tip in the x-axis, y-axis and z-axis directions. As another example, one or ordinary skill in the art will appreciate that the resilient members disclosed herein may be used in any suitable type of probe station, including non-cryogenic probe stations. As yet another example, the resilient members disclosed herein may compensate for forces tending to move a probe tip from a location on a sample that are caused by something other than movement of a probe arm (e.g., movement of a sample) and/or that are caused by something other than a temperature change (e.g., vibrations). It is sought, therefore, to cover all such changes and modifications as fall within the spirit and scope of the general inventive concepts, and equivalents thereof.

The invention claimed is:

1. A probe assembly for use in a probe station having a chamber for receiving a sample to be measured, the probe assembly comprising:
   a probe body;
   a probe tip; and
   a resilient member connected to the probe body,
   wherein the probe body is supported in the chamber by a probe arm having a longitudinal axis,
   wherein the probe tip is connected to the resilient member,
   wherein the probe tip is configured to contact a sample in the chamber at a location to be measured,
   wherein the longitudinal axis of the probe arm is parallel to the sample; and
   wherein the resilient member decouples the probe tip from the probe body such that the probe tip resists movement from said location on the sample during movement of the probe body in a direction substantially parallel to said longitudinal axis of the probe arm, said movement of the probe body resulting from contraction or expansion of the probe arm due to a temperature change in the chamber.

2. The probe assembly of claim 1, wherein the probe tip maintains continuous contact with the sample at said location across a range of temperatures of 1.5 K to 475 K.

3. The probe assembly of claim 1, wherein the probe tip maintains continuous contact with the sample at said location across a range of temperatures of between 1.5 K to 475 K.

4. The probe assembly of claim 1, wherein the probe tip maintains continuous contact with the sample at said location across a range of temperatures, a size of the range of temperatures being greater than 10 K.

5. The probe assembly of claim 1, wherein said movement of the probe body results from external vibrations.

6. The probe assembly of claim 1, wherein the resilient member limits movement of the probe tip from said location on the sample to less than 5 μm.

7. The probe assembly of claim 1, wherein the resilient member includes a vertical member substantially perpendicular to the probe arm.

8. The probe assembly of claim 7, wherein a length of the vertical member is between 5 and 50 mm.

9. The probe assembly of claim 7, wherein the vertical member is one of a vertical bar, a leaf spring, and a double leaf spring.

10. The probe assembly of claim 7, wherein the resilient member further includes a horizontal member substantially parallel to the probe arm, and
wherein the vertical member and the horizontal member are connected.

11. The probe assembly of claim 10, wherein the vertical member and the horizontal member are substantially perpendicular to one another.

12. The probe assembly of claim 10, wherein a length of the horizontal member is between 2 and 50 mm.

13. The probe assembly of claim 10, wherein a length of the vertical member is greater than a length of the horizontal member.

14. The probe assembly of claim 10, wherein the horizontal member is one of a horizontal bar and an angled horizontal bar.

15. The probe assembly of claim 10, wherein the probe tip is integrated with one of the vertical member and the horizontal member.

16. A probe station comprising:
a chamber for receiving a sample to be measured;
a probe arm; and
a probe assembly,
wherein the probe arm has a longitudinal axis and supports the probe assembly within the chamber,
wherein the probe assembly includes a probe body, a probe tip, and a resilient member,
wherein the resilient member is connected to the probe body,
wherein the probe tip is connected to the resilient member,
wherein the probe tip is configured to contact a sample in the chamber at a location to be measured,
wherein the longitudinal axis of the probe arm is parallel to the sample; and
wherein the resilient member decouples the probe tip from the probe body such that the probe tip resists movement from said location on the sample during movement of the probe body in a direction substantially parallel to said longitudinal axis of the probe arm, said movement of the probe body resulting from contraction or expansion of the probe arm due to a temperature change in the chamber.

17. The probe station of claim 16, wherein the probe tip maintains continuous contact with the sample at said location across a range of temperatures of 1.5 K to 475 K.

18. The probe station of claim 16, wherein said movement of the probe body results from external vibrations.

19. The probe station of claim 16, wherein the resilient member limits movement of the probe tip from said location on the sample to less than 5 μm.

20. The probe station of claim 16, wherein the resilient member includes a vertical member substantially perpendicular to the probe arm, and
wherein the vertical member is one of a vertical bar, a leaf spring, and a double leaf spring.

21. The probe station of claim 20, wherein a length of the vertical member is between 5 and 50 mm.

22. The probe station of claim 20, wherein the resilient member further includes a horizontal member substantially parallel to the probe arm,
wherein the horizontal member is one of a horizontal bar and an angled horizontal bar, and
wherein the vertical member and the horizontal member are connected.

23. The probe station of claim 22, wherein a length of the horizontal member is between 2 and 50 mm.

24. The probe station of claim 22, wherein a length of the vertical member is greater than a length of the horizontal member.

25. The probe station of claim 22, wherein the probe tip is integrated with one of the vertical member and the horizontal member.

26. The probe station of claim 16, wherein the probe assembly is detachably connected to the probe arm.

27. The probe station of claim 16, wherein the probe station includes a plurality of probe arms and a corresponding plurality of probe assemblies.

28. The probe station of claim 16, wherein the probe station is operable to form a vacuum in the chamber.

29. The probe station of claim 16, wherein the chamber includes a viewport configured to allow for external inspection of the sample within the chamber.

* * * * *